US006694461B1

(12) United States Patent
Treuer

(10) Patent No.: US 6,694,461 B1
(45) Date of Patent: Feb. 17, 2004

(54) SYSTEM AND METHOD FOR TESTING INTEGRATED MEMORIES

(75) Inventor: Robert P. Treuer, Markham (CA)

(73) Assignee: ATI International Srl, Barbados (KN)

( * ) Notice: Subject to any disclaimer, the term of this patent is extended or adjusted under 35 U.S.C. 154(b) by 0 days.

(21) Appl. No.: 09/360,568

(22) Filed: Jul. 26, 1999

(51) Int. Cl.[7] .......................... G11C 29/00; G01R 31/28
(52) U.S. Cl. ........................ 714/719; 714/727; 714/730
(58) Field of Search ................................ 714/719, 730, 714/727; 365/200, 201

(56) References Cited

U.S. PATENT DOCUMENTS

| | | | | |
|---|---|---|---|---|
| 4,715,034 A | * | 12/1987 | Jacobson .................... 714/719 |
| 4,835,774 A | * | 5/1989 | Ooshima et al. ............ 714/719 |
| 4,903,266 A | * | 2/1990 | Hack ......................... 714/719 |
| 5,018,145 A | * | 5/1991 | Kikuchi et al. ............. 714/743 |
| 5,216,673 A | * | 6/1993 | Kanai ........................ 714/719 |
| 5,263,029 A | * | 11/1993 | Wicklund, Jr. .............. 714/718 |
| 5,475,692 A | * | 12/1995 | Hatano et al. .............. 714/719 |
| 5,475,815 A | * | 12/1995 | Byers et al. ................. 714/32 |
| 5,646,948 A | * | 7/1997 | Kobayashi et al. ......... 714/719 |
| 5,668,764 A | * | 9/1997 | Surlekar .................... 365/201 |
| 5,706,234 A | * | 1/1998 | Pilch et al. ................. 365/201 |
| 5,757,817 A | * | 5/1998 | Bolyn et al. ................ 714/719 |
| 5,831,989 A | * | 11/1998 | Fujisaki .................... 714/723 |
| 5,835,502 A | * | 11/1998 | Aipperspach et al. ....... 714/718 |
| 5,920,515 A | * | 7/1999 | Shaik et al. ................ 365/200 |
| 5,946,247 A | * | 8/1999 | Osawa et al. ............... 365/201 |
| 5,974,579 A | * | 10/1999 | Lepejian et al. ............ 714/733 |
| 6,011,748 A | * | 1/2000 | Lepejian et al. ............ 365/233 |
| 6,148,426 A | * | 11/2000 | Kim et al. .................. 714/733 |
| 6,175,529 B1 | * | 1/2001 | Otsuka et al. .............. 365/201 |
| 6,216,241 B1 | * | 4/2001 | Fenstermaker et al. ..... 714/718 |
| 6,247,153 B1 | * | 6/2001 | Jeon et al. .................. 714/718 |
| 6,297,997 B1 | * | 10/2001 | Ohtani et al. .............. 365/201 |
| 6,321,356 B1 | * | 11/2001 | Snodgrass et al. .......... 714/738 |
| 6,338,154 B2 | * | 1/2002 | Kim .......................... 714/743 |

OTHER PUBLICATIONS

"Using March Tests to Test SRAMs," IEEE Design & Test of Computers, Mar. 1993, pp. 8–14.
"Realistic Built–In Self–Test for Static SRAMs," IEEE Design & Test of Computers, Feb. 1989, pp. 26–34.

* cited by examiner

Primary Examiner—Albert Decady
Assistant Examiner—Joseph D. Torres
(74) Attorney, Agent, or Firm—Vedder, Price, Kaufman & Kammholz, P.C.

(57) ABSTRACT

An address generator provides for generation of addresses for a plurality of different tests by allowing for primitive polynomial-based pseudo-random bit-streams to be shifted into the address generator. Embodiments of the present invention utilize the address values to generate data values to be stored in a memory under test. Likewise, an expected data value is generated and compared to the stored value. A data comparator verifies the stored data to the expected value. A single latch stores compare results for a plurality of memory locations.

22 Claims, 8 Drawing Sheets

SYSTEM AND METHOD FOR TESTING INTEGRATED MEMORIES

FIELD OF THE INVENTION

The present invention generally relates to the testing of integrated memories, and more specifically to the testing of memories having test collars.

BACKGROUND OF THE INVENTION

The testing of complex integrated devices, such as microprocessors, is necessary in order to assure proper operation of these devices. For integrated devices that have associated memory blocks, it is necessary to assure functionality of the memory. One prior art method of testing integrated memory blocks is to pin-out, either directly or through multiplexors, the address, control and data pins of the memory. In this manner, it is possible to exercise all storage locations of the memory to ensure proper operation. However, the pin count needed to test a device in this manner can be larger than the number of pins available. In addition, for each memory multiplexed in this manner, additional logic is introduced into the delay paths of the device, resulting in slower input/output (IO) propagation times that can affect performance.

Prior art FIG. 1 illustrates another prior art solution for testing integrated memories. Specifically, a Built-In Self Test (BIST) controller is used to automatically verify functionality of individual blocks of memory. For example, on start up, the BIST controller will perform a test routine to verify the integrity of the memory. If errors are found, they are reported.

FIG. 1 illustrates a device 100 having two BIST controllers for testing three integrated memories. The portion 100 of FIG. 1 represents a single block of memory being tested by a BIST controller. Generally, the BIST controller includes a test collar which, in conjunction with the BIST controller, generates addresses, data values, and compares received results to expected results. The portion 120 of FIG. 1 represents a double block of memories being tested by a single BIST controller. The use of BIST technology dedicates BIST hardware to specific memory locations. As a result, when a device has many different sizes or kinds of memory devices it is necessary for separate BIST controllers and associated collars to be provided. This increases the size of a memory block in the range of 2% to 8%.

Testability techniques can be implemented using modem simulation and layout tools. However, these tools only perform fixed test algorithms. For example, these tools are only capable of implementing March algorithms to detect errors. March algorithms read and write data in an up direction (incrementing address values) or in a down direction. While such tests are good enough for establishing production testing of traditional sized memories, sufficient test coverage is not available for development and debugging purposes.

Conventionally available tools and techniques for testing integrated memories do not have the flexibility to test wide varieties of memories. For example, modem graphics devices utilize small word sizes (8-bits or less) and very large word sizes (128-bits or more). Within these ranges, the address space can be a few bytes or Kilobytes. However, a problem with commercially available tools is that they are optimized to efficiently support only the most common memory types and sizes.

Therefore, a system and method for testing integrated memories that overcomes these problems would be desirable.

DETAILED DESCRIPTION OF THE DRAWINGS

Figure 1:
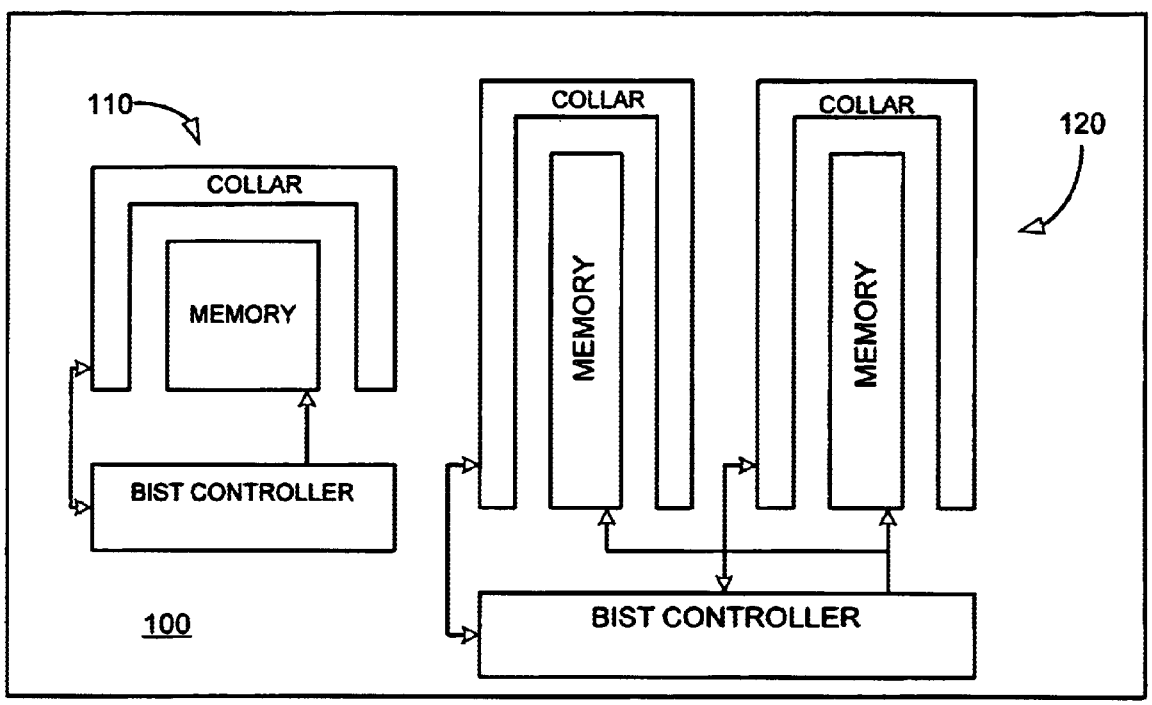
FIG. 1 illustrates a prior art device having integrated memories.
Figure 2:
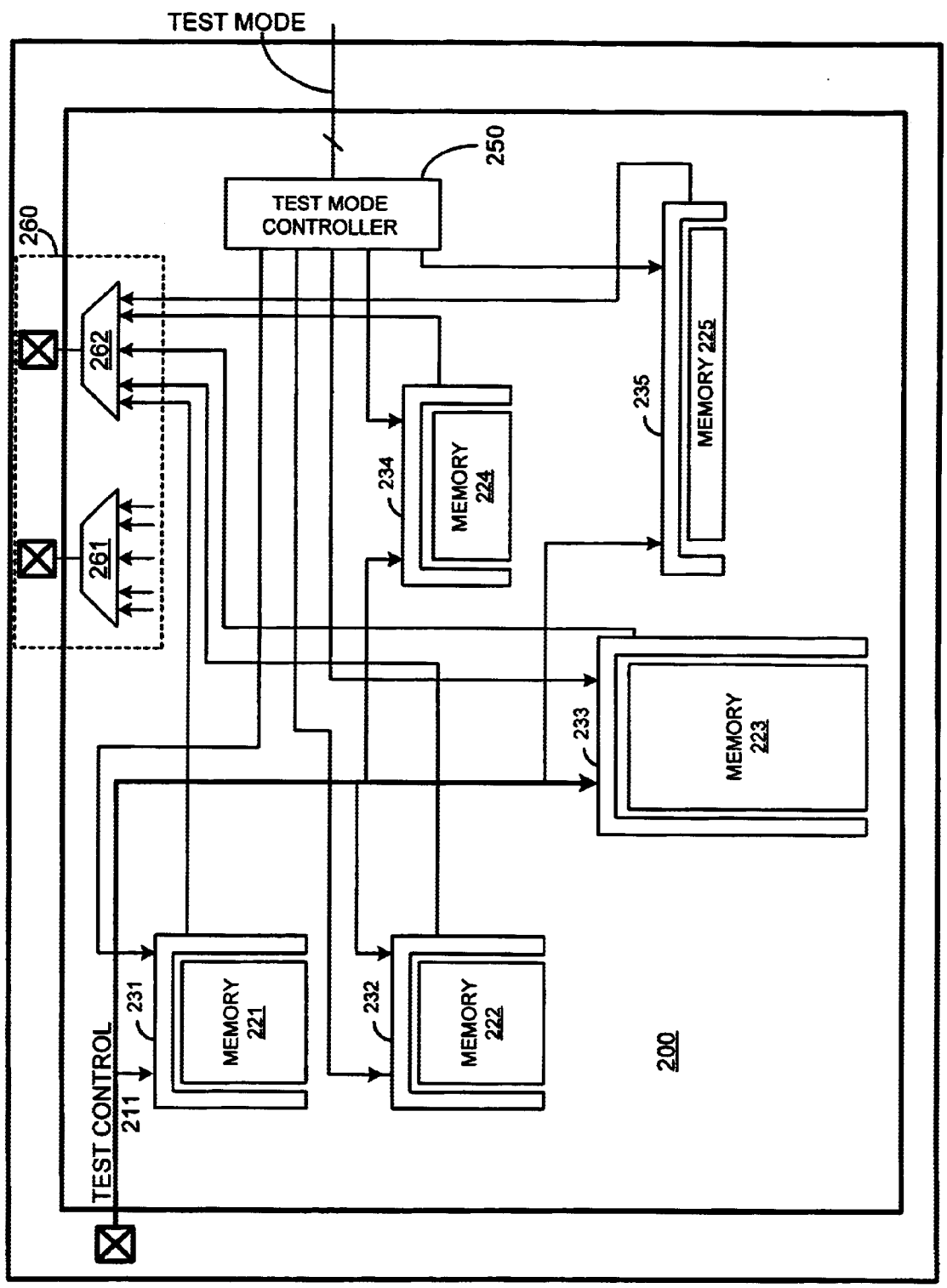
FIG. 2 illustrates, in block form, an integrated device in accordance with the present invention.

FIG. 2 illustrates a specific embodiment of a system 200 having integrated memory in accordance with the present invention. The system 200 includes memories 221–225. The memories 221–225 are illustrated as having various heights and widths in order to represent varying address space sizes and word widths. For example, memories 221 and 222 can each represent memories having 8-bit words stored within a 256-word memory space. While memory 223 can represent a memory having 128-bit words stored within a 1024 (1K) word memory space.

Each memory 221–225 has an associated test collar. The test collars can be enabled individually based upon a test mode selection indicator provided by the Test Mode Controller 250. Each test collar is further connected to a common Test Control bus 211. Test Control bus 211 provides the control signals necessary to execute specific types of memory testing. Generally, the test to be performed will be a function of both the signal from the Test Mode Controller 250, and the actual control signal provided via Test Control bus 211. Results from the various memories are provided through the multiplexor 260. Specifically, each Collar 231–235, or a portion of the Collars 231–235, shares output pads through a multiplexor. As illustrated in FIG. 2, the multiplexor 260 includes individual multiplexors 261 and 262. Individual multiplexor 262 selects a signal from one of Collar 231–235 to provide to the output of device 200. Individual multiplexors are connected to those collars having a second output.

In operation, a user provides a TEST MODE signal to select one of the memories of device 200 for testing. The TEST MODE signal can be responsible for merely selecting a memory, as well as be responsible for specifying a specific test. Once a memory is selected using the TEST MODE signal, the Test Control bus 211 is used to control the implementation for the test. The Test Control bus 211 signal can also define, or further define the test to be performed. For example, tests capable of being performed in accordance with the present invention include March-2 test, March-3 test, March-4 test, March-5 test, Butterfly test, and the Galpat test.

The Test Control bus 211 can also be used to freeze a memory by writing a value into a latch associated with the device that disables the memory's write enable. For example, a latch in each memory's test collar can be set by the test control signals.

Figure 3:
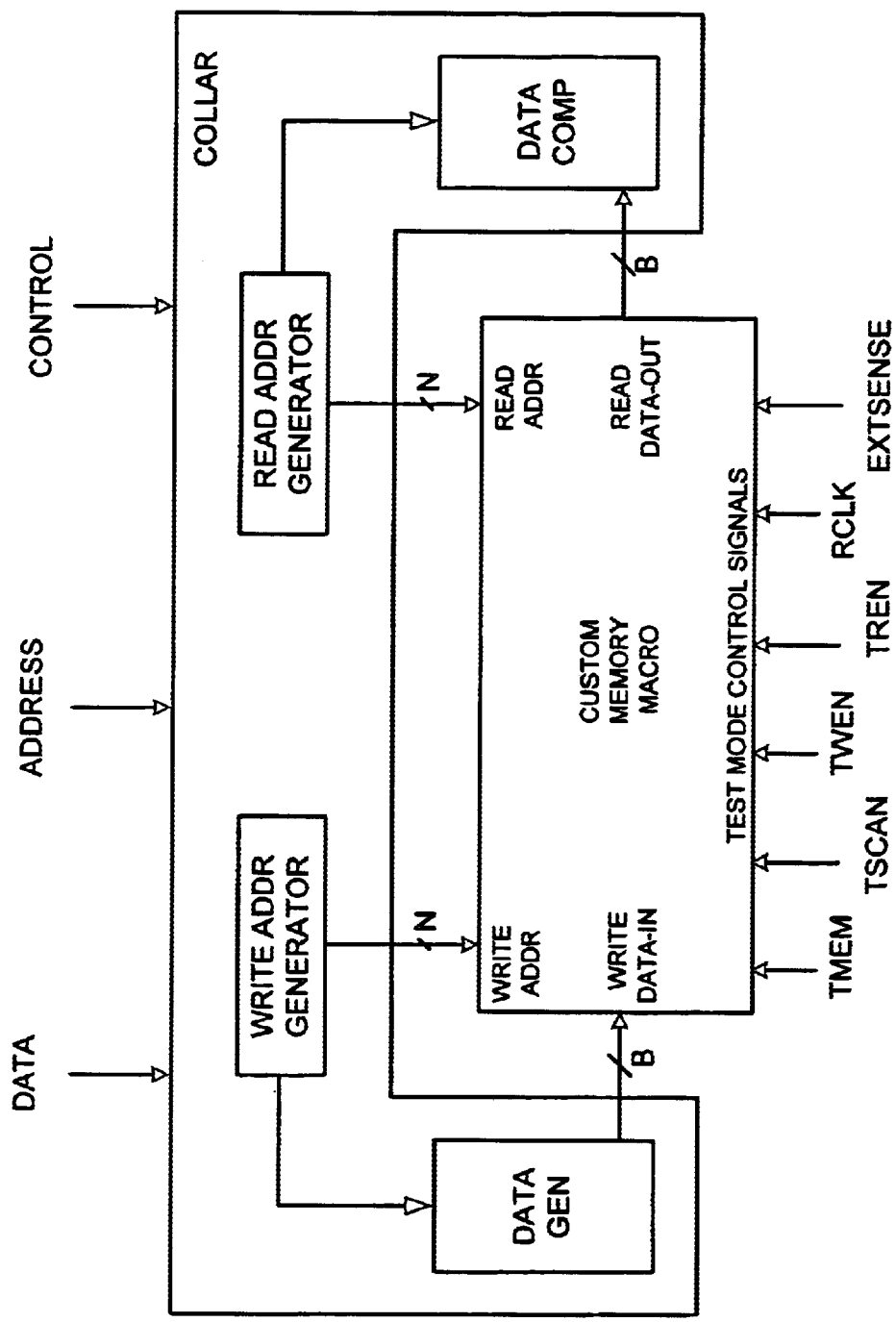
FIG. 3 illustrates, in block form, a custom memory having an associated test collar.

FIG. 3 illustrates in greater detail, a memory array, or macro, and its associated collar. In a general sense, the pins of any kind of memory macro can be viewed as belonging to one of three groups: the data pins, the address pins, and the control pins. For the custom memories being designed for specific products, the associate pins can be broken down more specifically. For example, it is possible to implement memories having only unidirectional data pins, and separate sets of address pins for read and write operations, with the control pins allowing for concurrent read and write operations. Therefore, for a specific memory implementation, there are 7 categories of pins:

(1) the data input pins, also called "write data" pins, (2) the data output pins, also called "read data" pins, (3) the write address pins, (4) the read address pins, (5) the write control pins, usually just a "write clock" and a "write enable", (6) the read control pins, usually just a "read clock", a "read enable" and an "extended sense", (7) the test control pins, usually just TMEM and TSCAN, which represent "memory test mode" and "scan test mode", respectively.

Some of these pin categories (specifically #1, #3, #4, #5 and partly #6) can have "twinned pins", where each pin has a "proper pin", which is used during normal operation, and a "test pin", which is used during a special memory test mode. Inside the custom memory macro, each pair of "twinned" pins is driving a 2-to-1 multiplexor which chooses whether to use the "proper pin" or the "test pin". All of these 2-to-1 multiplexors are controlled by a single select signal, namely TMEM.

In order to support the special memory test mode mentioned above, a test collar is used. The test collar comprises extra circuitry that surrounds each custom memory, and is used for test purposes only. The components of the test collar have a one-to-one correspondence with the 7 categories of pins described above. Each collar must contain circuitry to perform the following functions:

(1) data input generation, (2) data output comparison with expected responses, (3) write address generation, (4) read address generation, (5) write control generation, (6) read control generation, (7) test mode control.

Some of these functions are implemented with global signals that are routed chip-wide and illustrated in FIG. 3. Function #7 (test mode control) is implemented by the 2 global signals TMEM and TSCAN. Function #6 (read control generation) is implemented by the global signal TREN, by effective control of the clock tree connected to RCLK, and by appropriate control over EXTSENSE. Function #5 (write control generation) is implemented by the global signal TWEN, and by connecting TWCLK to the same clock tree as RCLK, which is already effectively under external control. Note that the same clock tree, generally the Read clock (RCLK), is used for both read and write operations during test mode. In summary, for the custom memory macro of FIG. 3, the functions #7, #6, and #5 are implemented by 4 global signals, 1 controllable clock tree, and possibly 1 additional global signal for EXTSENSE. A few custom memories have more than one write port or more than one read port, which may increase the number of global signals needed to implement functions #5 and/or #6.

Theoretically, the remaining 4 functions (#1, #2, #3, #4) can also be implemented by connecting the first 4 categories of test pins to 4 chip-wide test-busses. However by serially-transmitting and/or locally-generating the bit patterns required for the remaining 4 functions, the cost of globally routing the additional lines is avoided.

There are many test algorithms used to verify memory functionality. The ability to control and observe integrated memory devices increases the complexity of testing integrated memories. The most efficient memory test algorithms, in terms of fault coverage, are in the family of so-called "march tests". A march test is composed of a sequence of "march elements", where each march element is a "For-Loop" that spans the complete address-space in either "up" or "down" direction, and performs the same sequence of read and/or write operations at each address location. Here is an example of a very common "march test", written in a very compact, customary notation:

| March-1 |
| --- |
| ⇑(w0) |
| ⇑(r0, w1) |
| ⇑(r1, w0) |
| ⇓(r0, w1) |
| ⇓(r1, w0) |

The algorithm above assumes a "single-bit" type of memory, where each bit has a distinct, different address. There are 5 "march elements" shown above, of which the first 3 are in the "up" direction, and the last 2 are in the "down" direction. The "up" direction can be the obvious "increasing" order, from 0 to N−1, where N is the total number of addresses, or it can be any arbitrary permutation of all addresses. The only restriction is that the "down" direction must be exactly the reverse of the "up" addressing sequence. The "write" operations are represented by w0 and w1, where w0 writes a 0 and w1 rights a 1. The "read" operations, with expected data specified, are represented by r0 and r1, where r0 indicates that 0 is the expected read value, and r0 indicates that the expected read value is a 1.

Most integrated memories have multi-bit words of data that are written to or read from each address location. If the above March-1 test is modified by simply replacing the single bit 0 and single bit 1, with whole words of all 0's or all 1's, then certain coupling faults between storage cells in the same word would fail to be detected. There are several specific embodiments, or schemes, for extending a single-bit march test to a multi-bit march test. The goal of the various embodiments is to obtain high fault coverage. Each scheme creates different data patterns to replace the single bit 0 and single bit 1. The schemes are named according to the type of replacement data patterns, namely: (1) primary, (2) serialized, and (3) address-based.

For a word with b bits, the number of primary data patterns equals $2(\lceil \log_2 b \rceil + 1)$. The primary data patterns are all the periodic power-of-2 patterns and the all 0's and all 1's patterns. For b=4, the "primary" data patterns are shown below:

| "0" replaced by | "1" replaced by |
| --- | --- |
| 0101 | 1010 |
| 0011 | 1100 |
| 0000 | 1111 |

For b=16, the "primary" data patterns are shown below:

| "0" replaced by | "1" replaced by |
| --- | --- |
| 0101010101010101 | 1010101010101010 |
| 0011001100110011 | 1100110011001100 |
| 0000111100001111 | 1111000011110000 |
| 0000000011111111 | 1111111100000000 |
| 0000000000000000 | 1111111111111111 |

The "primary" data pattern equivalent of the March-1 test is obtained by repeating March-1 for each complementary pair of patterns that, replace the single bit 0 and 1. For b=4, March-1 is repeated 3 times:

March-2
(4-bit version)

⇑(w0101)
⇑(r0101, w1010)
⇑(r1010, w0101)
⇓(r0101, w1010)
⇓(r1010, w0101)
⇑(w0011)
⇑(r0011, w1100)
⇑(r1100, w0011)
⇓(r0011, w1100)
⇓(r1100, w0011)
⇑(w0000)
⇑(r0000, w1111)
⇑(r1111, w0000)
⇓(r0000, w1111)
⇓(r1111, w0000)

For b=16, March-1 is repeated 5 times:

March-2
(16-bit version)

⇑(w0101010101010101)
⇑(r0101010101010101, w1010101010101010)
⇑(r1010101010101010, w0101010101010101)
⇓(r0101010101010101, w1010101010101010)
⇓(r1010101010101010, w0101010101010101)
⇑(w0011001100110011)
⇑(r0011001100110011, w1100110011001100)
⇑(r1100110011001100, w0011001100110011)
⇓(r0011001100110011, w1100110011001100)
⇓(r1100110011001100, w0011001100110011)
⇑(w0000111100001111)
⇑(r0000111100001111, w1111000011110000)
⇑(r1111000011110000, w0000111100001111)
⇓(r0000111100001111, w1111000011110000)
⇓(r1111000011110000, w0000111100001111)
⇑(w0000000011111111)
⇑(r0000000011111111, w1111111100000000)

March-2
(16-bit version)

⇑(r1111111100000000, w0000000011111111)
⇓(r0000000011111111, w1111111100000000)
⇓(r1111111100000000, w0000000011111111)
⇑(w0000000000000000)
⇑(r0000000000000000, w1111111111111111)
⇑(r1111111111111111, w0000000000000000)
⇓(r0000000000000000, w1111111111111111)
⇓(r1111111111111111, w0000000000000000)

There are a few mathematically-definable coupling faults, within the same multi-bit word, that the above March-2 tests would not be able to detect. All physically-realistic coupling faults would be caught, however. In the interest of detecting physically-realistic faults, it is common to use only the unshaded sections in March-2, which employ only the highest frequency pattern pairs, and the completely constant pattern pairs. The shaded middle pattern pairs are much less likely to detect any additional faults in the cell array. However, if the memory macro uses multiplexing between the storage cell array and the read/write data ports, then these shaded patterns provide extensive additional fault coverage for the multiplexors themselves.

In understanding serialized data patterns, consider a 16-bit cell array arranged in a 4 by 4 square. If we apply March-1 to this cell array, we get the following behavior at the start of the second march element:

| 0000 | 1000 | 1100 | 1110 | 1111 | 1111 | 1111 | 1111 | 1111 | 1111 | 1111 |
| --- | --- | --- | --- | --- | --- | --- | --- | --- | --- | --- |
| 0000 | 0000 | 0000 | 0000 | 0000 | 1000 | 1100 | 1110 | 1111 | 1111 | 1111 |
| 0000 | 0000 | 0000 | 0000 | 0000 | 0000 | 0000 | 0000 | 0000 | 1000 | 1100 |
| 0000 | 0000 | 0000 | 0000 | 0000 | 0000 | 0000 | 0000 | 0000 | 0000 | 0000 |

This cell array could also be viewed as 4-word array, with 4 bits per word. In that case, the 1-bit march element ⇑(r0, w1) becomes a much longer 4-bit march element ⇑(r0000, w1000, r1000, w1100, r1100, w1110, r1110, w1111). The serialized version of March-1, for a 4-bit word-size, is shown below:

March-3 (4-bit version)

⇑(w0000)
⇑(r0000, w1000, r1000, w1100, r1100, w1110, r1110, w1111)
⇑(r1111, w0111, r0111, w0011, r0011, w0001, r0001, w0000)
⇓(r0000, w1000, r1000, w1100, r1100, w1110, r1110, w1111)
⇓(r1111, w0111, r0111, w0011, r0011, w0001, r0001, w0000)

March tests have a run-time that is linear with respect to the number of addresses, but which is multiplied by a factor representing the number of bits per word. That word-size factor is O(b) for serialized patterns. For primary patterns, the word-size factor is O(log$_2$b), if all primary patterns are used, or O(1), if only the unshaded patterns are used. For very wide data-word memories, the run-time of march tests using serialized patterns is much greater than march tests using primary patterns.

For the previous 2 types of patterns, there is no restriction relating the number of bits per word, b, and the number of bits used for addressing, n. (If the total number of addresses is N, then n=⌈log$_2$N⌉.) If our custom macros satisfy the condition that b>=n, then there is a third class of patterns, address-based data patterns, which may be employed, which are based on using the n-bit address pattern within the b-bit data word. For simplicity, and with no loss of generality, in the following discussion, assume that b=n. Let A represent the binary address pattern, and let $\overline{A}$ represent the one's-complement of the binary address pattern. Then March-1 can be extended to multi-bit words, as shown below:

| March-4 |
|---|
| ⇑(wA) |
| ⇑(rA, w$\overline{A}$) |
| ⇑(r$\overline{A}$, wA) |

You will notice that the 2 "down" direction march elements have been deleted. Usually, march tests are written in a symmetrical fashion, where all the "up" direction march elements (except for the obvious initialize-to-all-0's first march element) are repeated as "down" direction march elements. The purpose of this repetition, using both addressing orders, is to detect address decoder faults. But if the binary-contents of each address location is now unique, then we can detect those same address decoder faults by traversing the addresses in one order only. This scheme actually reduces the run-time of the 1-bit version, but only when b>=n.

To detect coupling faults within each data-word, we can perform a bit-wise exclusive-OR operation on each address pattern with the primary data patterns. To detect only the physically-realistic coupling faults, we only need the very first and very last of the primary patterns. The very first primary pattern is also known as the "even-odd" pattern, and the very last primary pattern (all 0's and all 1's) can be interpreted as a mathematical identity operation. Let $\oplus$ represent the bit-wise exclusive-OR operation, then let

A=A⊕00000000 . . .

$\overline{A}$=A⊕11111111 . . .

Á=A⊕0101101 . . .

À=A⊕10101010 . . .

Now we can expand March-4, in the style of March-2 (unshaded), as follows:

| March-5 |
|---|
| ⇑(wA) |
| ⇑(rA, w$\overline{A}$) |
| ⇑(r$\overline{A}$, wA) |
| ⇑(wÁ) |
| ⇑(rÁ, wÀ) |
| ⇑(rÀ, wÁ) |

Obviously, the remaining (shaded) primary patterns can also be bit-wise exclusive-ORed with the address pattern A, to provide multiplexor fault coverage, where applicable.

All of the re-formulations of March-1 shown above, deal with the replacement of the single data bit with multi-bit data patterns. A frequently useful variation, inspired by EXORing data with the even-odd data patterns, is to perform some data transformation conditional upon the least-significant address bit(s). When the address LSB is 0 (an even address), we may choose one operation, and when the address LSB is 1 (an odd address), we choose the other. This may create a checkerboard effect in some multi-bit-per-word storage cell arrays. We add even/odd subscripts to the read/write operations to specify this conditional operation. In the case of a single-bit-per-word storage cell array, we calculate the parity of 2 LSBs (the physical row address LSB and the physical column address LSB) to determine the "evenness or oddness" of an address. Two examples are given below: first, the checkerboard version of March-1, and second, the checkerboard version of March-5.

| March-6 |
|---|
| ⇑(w$_e$0\|w$_o$1) |
| ⇑(r$_e$0\|r$_o$1, w$_e$1\|w$_o$0) |
| ⇑(r$_e$1\|r$_o$0, w$_e$0\|w$_o$1) |
| ⇓(r$_e$0\|r$_o$1, w$_e$1\|w$_o$0) |
| ⇓(r$_e$1\|r$_o$0, w$_e$0\|w$_o$1) |

| March-7 |
|---|
| ⇑(w$_e$A\|w$_o$$\overline{A}$) |
| ⇑(r$_e$A\|r$_o$$\overline{A}$, w$_e$$\overline{A}$\|w$_o$A) |
| ⇑(r$_e$$\overline{A}$\|r$_o$A, w$_e$A\|w$_o$$\overline{A}$) |
| ⇑(w$_e$Á\|w$_o$À) |
| ⇑(r$_e$Á\|r$_o$À, w$_e$À\|w$_o$Á) |
| ⇑(r$_e$À\|r$_o$Á, w$_e$Á\|w$_o$À) |

Fancier checker boarding is possible by conditioning operations upon more than just one or two "least-significant" address bit(s).

The run-time of march tests is linear in the number of addresses, O(N). There are further types of tests, such as "butterfly tests" whose run-time complexity is O(N·log$_2$N), "galloping row/column tests" whose run-time complexity is O(N·√N), and "galloping pattern tests" whose run-time complexity is O(N$^2$). The names galrow, galcol, and galpat are commonly used to refer to "galloping row", "galloping column" and "galloping pattern", respectively. All the galloping and butterfly tests introduce a second level of nested "For-Loops" into the march elements' first level "For-Loop". The difference among the galloping and butterfly tests is in how much of the address-space is spanned by the inner "For-Loops". The galpat tests' inner "For-Loop" spans the entire address-space, hence the O(N$^2$) complexity. The galrow and galcol tests' inner "For-Loop" spans only addresses located within the same physical row or column of the storage cell array, hence the square-root within the O(N√N) complexity. The butterfly tests' inner "For-Loop" spans only addresses that are a Hamming-distance of 1 away from the current address in the outer (march element's) "For-Loop", hence the base-2 logarithm in the O(N·log$_2$N) complexity.

Since the march test notation is insufficient to represent the actions of the galloping and butterfly tests, we introduce some commonly used notation below. Since there are now 2 levels of "For-Loops", we must name the "Loop-Index" of each one, in order to simplify our discussion. The outer Loop-Index is usually called the "base-address" or "base-cell" (also known as the "home address"). The inner Loop-Index is usually called the "moving-address" or "moving-cell" (also known as the "away address"). March elements are, by definition, looping with the "base-cell" exclusively.

Here is the compact notation for an arbitrary inner loop, with its pseudo-code equivalent:

$$\begin{pmatrix} ra & \cdot & wb & rb & \cdot \\ \cdot & rc & \cdot & \cdot & rc \end{pmatrix}$$

for moving-cell=0 to N−1, excluding the address of base-cell
   if stored-value[moving-cell]≠a, then error(moving-cell)
   if stored-value[base-cell]≠c, then error(base-cell)
   write-to[moving-cell]←b
   if stored-value[moving-cell]≠b, then error(moving-cell)
   if stored-value[base-cell]≠c, then error(base-cell)
endfor The upper row specifies "moving-cell" operations, and the lower row specifies "base-cell" operations. Almost always, the "base-cell" operations within inner loops are restricted to read operations only. The "moving-cell" may be written or read. One of the simplest and most widely known versions of (single-bit) galpat is shown below, first in compact notation, then in pseudo-code:

| Galpat − 1 |
| --- |
| ⇑ (w0) |
| $\Uparrow\left(w1, r1, \begin{pmatrix} r0 & \cdot \\ \cdot & r1 \end{pmatrix}, w0\right)$ |
| ⇑ (w1) |
| $\Uparrow\left(w0, r0, \begin{pmatrix} r1 & \cdot \\ \cdot & r0 \end{pmatrix}, w1\right)$ | for base-cell=0 to N−1
   write-to[base-cell]←0
endfor
for base-cell=0 to N−1
   write-to[base-cell]←1
   if stored-value[base-cell]≠1, then error(base-cell)
   for moving-cell=0 to N−1, excluding the address of base-cell
     if stored-value[moving-cell]≠0, then error(moving-cell)
     if stored-value[base-cell]≠1, then error(base-cell)
   endfor
   write-to[base-cell]←0
endfor
for base-cell=0 to N−1
   write-to[base-cell]←1
endfor
for base-cell=0 to N−1
   write-to[base-cell]←0
   if stored-value[base-cell]≠0, then error(base-cell)
   for moving-cell=0 to N−1, excluding the address of base-cell
     if stored-value[moving-cell]≠1, then error(moving-cell)
     if stored-value[base-cell]≠0, then error(base-cell)
   endfor
   write-to[base-cell]←1
endfor Obviously, this version of galpat would be converted to a multi-bit version, for use with our custom memories.

A butterfly test uses a similar notation, except that the delimiters are not parentheses but angle-brackets instead. The moving-cell only takes on values that are a Hamming-distance of 1 away from the base-cell.

$$\left\langle \begin{matrix} \cdot & rb \\ ra & \cdot \end{matrix} \right\rangle$$

for walking-1-bit∈{10000000, 01000000, 00100000, . . . , 00000010, 00000001} do: moving-cell=base-cell⊕walking-1-bit
   if stored-value[base-cell]≠a, then error(base-cell)
   if stored-value[moving-cell]≠b, then error(moving-cell)
endfor Here is the most common version of the (single-bit) butterfly test:

| Butterfly − 1 |
| --- |
| ⇑ (w0) |
| $\Uparrow\left(w1, \begin{pmatrix} \cdot & r0 \\ r1 & \cdot \end{pmatrix}, w0\right)$ |

This test is designed to detect stuck-open faults that cause sequential behavior in the address decoders, which march tests are unable to detect.

Now that we have sufficient background material about the different types of memory tests that we may use, we may proceed with descriptions of circuits that support the operations needed by these tests.

If March-2 and March-3 tests must be supported, because b<n, then both an "up" and a "down" address generation capability are needed. Specific embodiments capable of supporting this include a binary up-down counter, a bi-directional LFSR (linear feedback shift register), or two shift-registers (shifting in opposite directions) with a 2-to-1 multiplexor merging their outputs. For custom memories that have non-power-of-2 addressing, the binary up-down counter is the clear favorite. The two shift-registers with mux is an attractive circuit because of its simplicity and high-speed. Each shift-register circuit works by imitating an "LFSR with one external (wide-fanin) EXOR-gate feeding the serial-input". The shift-register is more flexible than an actual LFSR because we are not committed to using just one primitive polynomial to generate the addressing sequence.

If we can use tests like March-4 and March-5, because b>=n, then we require smaller circuits. For example, either (1) a binary up-only counter, or (2) a unidirectional LFSR, or (3) one shift-register can be used. Again, where non-power-of-2 addressing is used, the binary up-only counter is the clear favorite, although the single shift-register is attractively simple.

In order to support more than just march tests, such as multi-bit versions of Butterfly-1 and Galpat-1, the address generator will contain, at least: (a) a multiplexor for each address bit, (b) an EXOR-gate per bit, and (c) two sources of addresses, of which at least one must be a shift-register, and the other may be either a binary counter, or an opposite-direction shift-register. If b<n, then the binary counter will have up/down counting ability, else if b>=n, then it can be an up-only counter. The relation of b to n is irrelevant if the second address source is the opposite-direction shift-register.

Figure 4:
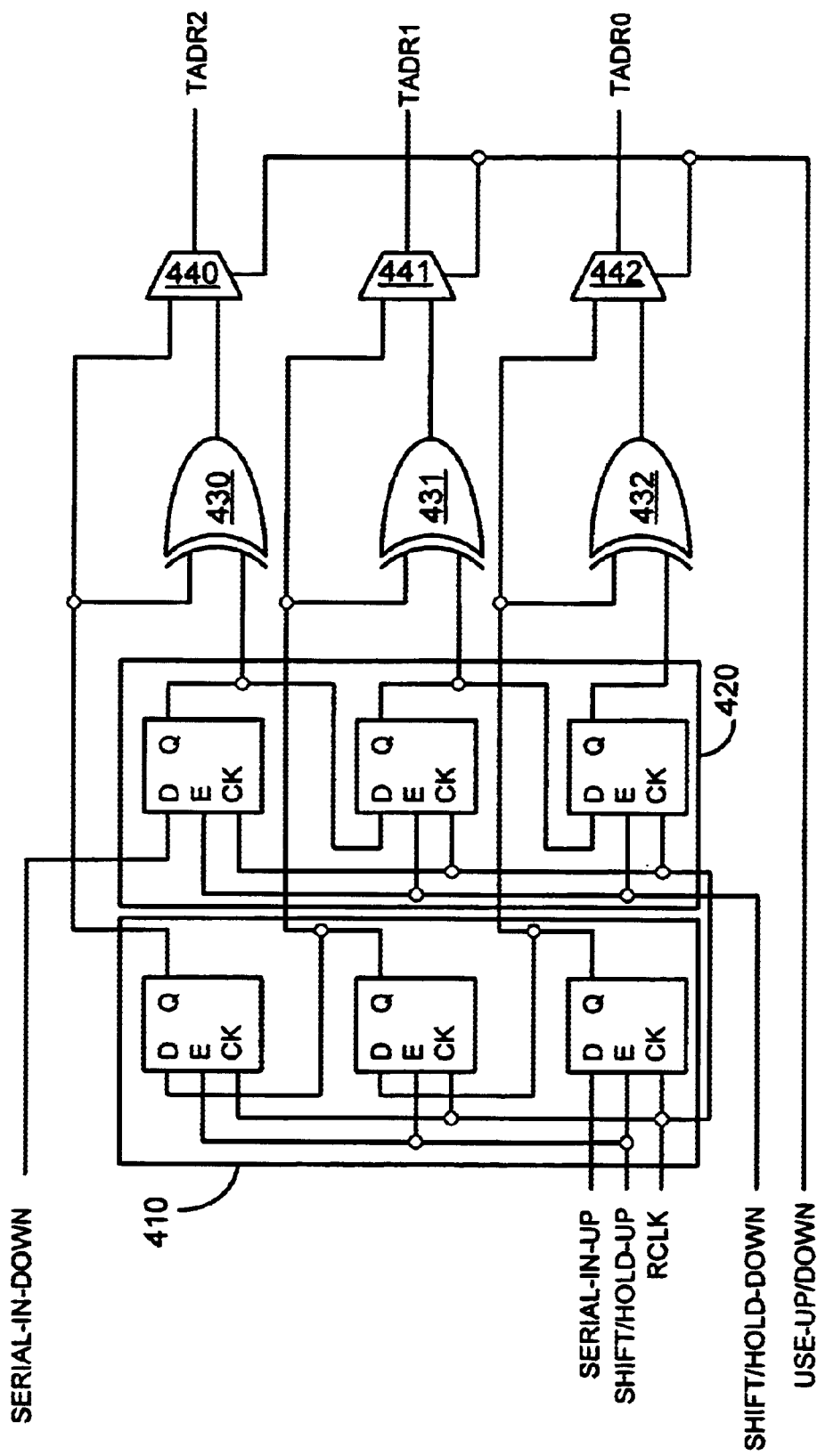
FIG. 4 illustrates, in logic schematic form, an address generator in accordance with the present invention.

FIG. 4 illustrates a specific embodiment of a 3-bit version of an address generator that supports all possible March, Butterfly and Galpat tests, using only shift-registers as address sources.

In implementing FIG. 4 at the chip-level, RCLK is already accounted for as illustrated in FIG. 3. The TADR0–TADR2 pins coupled to multiplexers 440, 441, 442 respectively, belong to the custom memory itself. Therefore, an extra 5 global signals are needed for this particular implementation of an address generator, namely: SHIFT/HOLD-UP, SERIAL-IN-UP; SHIFT/HOLD-DOWN, SERIAL-IN-DOWN, USE-UP/DOWN. If the up-direction shift register 410 were replaced by a binary up-only counter, then the same number of extra global signals would still be needed, however some names would be changed: RESET-COUNTER would replace SERIAL-IN-UP, and COUNT/HOLD-UP would replace SHIFT/HOLD-UP. If Butterfly and Galpat tests are not supported, then only 2 global signals are needed, namely the 2 belonging to the up-direction shift-register 410, or the up-only counter (assuming b>=n; or 3 global signals for the up-down counter, assuming b<n, since another signal is needed to specify the direction of counting).

The 2-to-1 multiplexors 440–442 select between the up-direction shift-register, or the exclusive-OR 430, 431, 432 of the two shift-registers 410, 420. If the down-direction shift-register 420 is being used during a Butterfly or Galpat test, then this exclusive-OR is exactly the functionality that we want. If the down-direction shift-register 420 is being used as the down-direction address source during a March test, then this will work correctly, if and only if, the up-direction shift register 410 is loaded with all 0's. But ending an LFSR-style address sequence on all 0's is easy to do, so this is not a problem, and it saves: the extra area of widening the multiplexors to 3-to-1, plus a sixth global signal since the wider mux would need 2 select signals instead of 1.

In FIG. 3, two address generators are shown: one for writing and the other for reading. For most custom memories, it will be possible to share one address generator for both write and read address ports. Two conditions must be satisfied to allow sharing to occur: (1) read and write operations must be pipelined by exactly the same number of clock cycles, and (2) the read and write ports must be close enough physically to justify the extra routing cost. Hence, if read and write operations are each pipelined by a different number of clock cycles, then there must be 2 independent address generators, each with its own set of 5 global signals (or 2 global signals, for March tests only, when b>=n; or 3 global signals, for March tests only, when b<n). To understand the implications of pipelined operations within a March test, consider the unpipelined and fully-general pipelined examples below:

| March – 8 (unpipelined) | pipelined Writes | pipelined Reads | pipelined Compares |
|---|---|---|---|
| ⇑ (w0, r0) | ⇑ (w0, –) | ⇑ (–, r*) | ⇑ (–, c0) |
| ⇑ (r0, w1, r1) | ⇑ (–, w1, –) | ⇑ (r*, –, r*) | ⇑ (c0, –, c1) |
| ⇑ (r1, w0, r0) | ⇑ (–, w0, –) | ⇑ (r*, –, r*) | ⇑ (c1, –, c0) |
| ⇓ (r0, w1, r1) | ⇓ (–, w1, –) | ⇓ (r*, –, r*) | ⇓ (c0, –, c1) |
| ⇓ (r1, w0, r0) | ⇓ (–, w0, –) | ⇓ (r*, –, r*) | ⇓ (c1, –, c0) |

This example shows 3 March tests running concurrently, the Write column containing writes and no-ops, the Read column containing reads (without expected values) and no-ops, and the Compare column containing comparisons with expected data and no-ops. This example exposes the hidden complexity of read operations, when pipelining is introduced. Write operations are very neat, by comparison with reads, because both the destination address and the destination data must be ready when the write enable signal is asserted. A complete read operation refers to 2 separate events in time: (1) the desired address must be ready when the read enable signal is asserted, and (2) the desired data shows up some time later. Hence, there are actually 3 latencies that we care about: (1) the time required to decode the write address and store the write data, (2) the time required to decode the read address, and (3) the time required to obtain the read data.

While the differential latency between the Write and Read address ports can be any arbitrary integer amount, memories having zero differential latency between the Write and Read address ports can share the same address generator. In this case, the pipelined march test simplifies to the form shown below.

| pipelined Writes/Reads | pipelined Compares |
|---|---|
| ⇑ (w0, r*) | ⇑ (–, c0) |
| ⇑ (r*, w1, r*) | ⇑ (c0, –, c1) |
| ⇑ (r*, w0, r*) | ⇑ (c1, –, c0) |
| ⇓ (r*, w1, r*) | ⇓ (c0, –, c1) |
| ⇓ (r*, w0, r*) | ⇓ (c1, –, c0) |

This allows 2 independent address generators to be used depending on the latency of the Compare operations, and on whether address-based patterns in our march tests are used (such as March-4, March-5, March-7). These address generation techniques correspond to step 801 of the method of FIG. 8.

Figure 5:
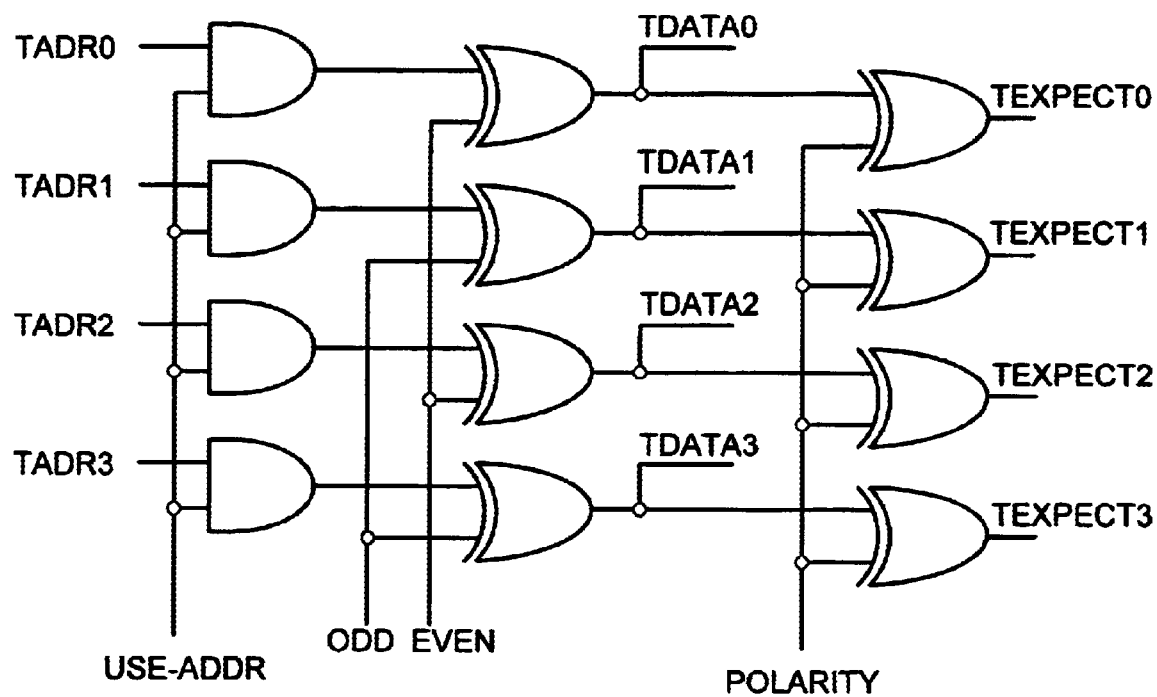
FIG. 5 illustrates, in logic schematic form, a data generator in accordance with the present invention.

The form of input data required is directly determined by which variation of the March tests that we choose to support. March-5, March-7, and similar "address-based data pattern" march tests are suitable for most custom memories. FIG. 5 illustrates a 4-bit version of a data generator.

The data generator of FIG. 5 uses 3 global signals, namely: USE-ADDR, EVEN, ODD. The USE-ADDR signal is not strictly required for March-5 testing, but it provides a low-cost method of turning off the address inputs and allowing the use of (unshaded) March-2 as a supplementary test. The step 802 of the method of FIG. 8 corresponds to these data generation techniques. Concurrent with steps of the method of FIG. 8, the generated data value may be stored in a memory location, such as in a RAM, ROM, buffer, or any other suitable memory location as recognized by one skilled in the art, designated at step 803 in FIG. 8.

The data generator of FIG. 5 can also be used to generate expected data values. The expected data value will generally be the same as the data stored, or its inverse. A polarity signal is connected to exclusive-or gates in the manner indicated to provide the correct polarity of compare data. The signals TEXPECT0–TEXPECT3 correspond to step 804 of the method of FIG. 8.

Data comparison is used to determine if the values have been stored and read properly. Data comparators fall into two major classes: (1) fully deterministic data comparators, which require a source of expected data, usually from a nearby "data generator and address generator pair"; and (2) signature analyzers, which do not require any source of expected data, but are instead implemented using "multi-input linear feedback shift registers (LFSRs)", commonly abbreviated as MISRs. If the actual data output is 8 bits or less in width, it may make more sense to simply route these 8 bits, or less, to some multiplexed output pins, rather than construct either type of comparator.

The flip-flops in a deterministic comparator all start with all 0's contents, to signify "no mismatches". As soon as a mismatch is detected at a particular bit position, that bit position's flip-flop stores a 1, which does not change until all the flip-flops are reset to all 0's again. Such a comparator tells us only which bit positions experienced mismatches. We find out about the mismatches when we serially shift-out the contents of the flip-flops. If we wanted to know at exactly which time-step the mismatch occurred, then we must either shift-out the flip-flops at every time-step (which would be painfully slow to do, and would invalidate the "at-speed" nature of all march tests), or add an additional tree of OR-gates to monitor the flip-flops' outputs (but that would only tell us when the first mismatch occurred, since the output would remain a steady 1 until the next reset happened), or add an additional tree of EXOR-gates to monitor the parity of the flip-flops' outputs (but that would fail to show us when 2 simultaneous mismatches happened).

In addition to generating data in the manner indicated, the data generator of FIG. 5 can be used for debugging purposes by allowing the contents of the memory to be read. For example, where each bit of memory is compared to an expected value using an exclusive or gate, and the compare results are latched in order to be observable external to the device, the data generator of FIG. 5 can allow the contents of the memory to be viewed by asserting all expected outputs to zero. By asserting all expected outputs to zero, the exclusive-or comparison of the actual data values to zero values asserted by the data generator will result in the stored data values being generated and latched. The expected values TEXPECT0–TEXPECT3 can be forced to zero by driving USE-ADDR, EVEN, ODD, and POLARITY low. By allowing the contents of internal memories to be accessed during a debug mode, with no additional circuitry, an advantage is realized over the prior art.

Another debug feature of the data generator of FIG. 5 is its ability to provide specific patterns to a memory. This is useful when it is desirable to initialize a memory to a specific pattern. By driving the USE-ADDR signal low, it is possible to assert and deassert ODD, and EVEN in order to write all ones, all zeros, or alternating one and zero patterns.

Figure 6:
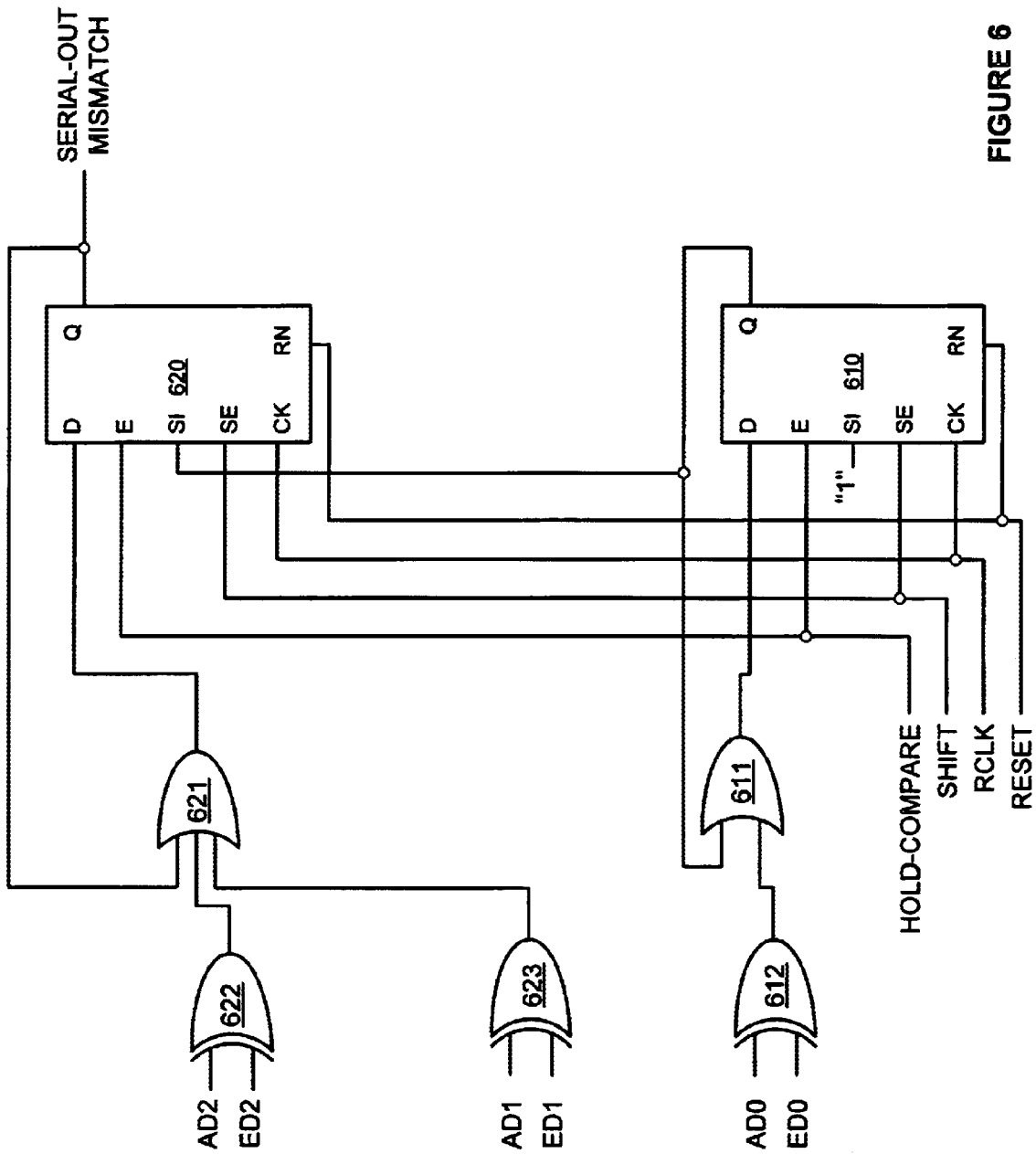
FIG. 6 illustrates, in logic schematic form, a data comparator in accordance with the present invention.

FIG. 6 shows how to construct a data comparator using SEDFFTR flip-flops 610 and 620 (Scannable, Enableable D-Flip-Flop, with synchronous Reset). The "expected data" (ED) comes from a nearby data generator circuit. The "actual data" (AD) comes from the custom memory itself. The RCLK is the clock used for all "test collar" circuits, as was previously explained. One "serial-out mismatch" signal must be routed to a multiplexed output pad; in the case of other embodiments of the present invention, multiple scan-out pads will be re-used by multiplexing the various "serial-out mismatch" signals through these multiple pads. A few input pads, for example 3, will act as mux-select signals, that will determine which group of "serial-out mismatch" signals are observable at any time. Besides the serial-out signal, this comparator also needs 3 global input signals for control, namely: SHIFT, RESET, HOLD-COMPARE.

Note that the first flip-flop's 610 SI pin has a Logic-1 driving it. This provides the rudimentary ability to check the operation of the flip-flop's shifting. RESET loads all the flip-flops with 0's, which are shifted out in b time-steps, followed by 1's thereafter as illustrated with OR gate 611 that ORs the flip-flop 610 b output and the output of the OR gate 611. The above-circuit happens to use an SEDFFTR for each output bit, but it could also be constructed using an SDFFTR, where the HOLD-COMPARE function would now be implemented by adding an AND-gate between the EXOR and OR-gates. In order to reduce the size of the test circuitry, the second flip-flop is associated with multiple bits of data. Specifically, the or gate 621 receives compare data from the EXOR gates 622 and 623. Such an implementation allows minimization of the test circuitry, while maintaining a high level of fault coverage.

Figure 7A:
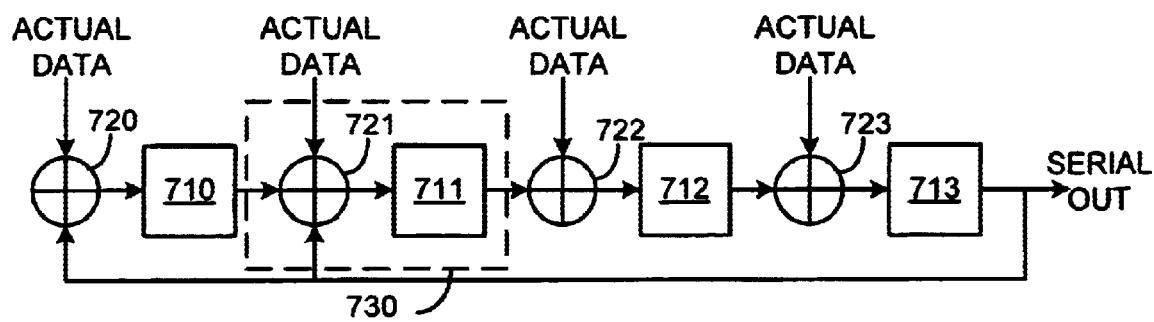
FIG. 7a illustrates a 4-bit MISR.

The major difference between the deterministic data comparator and the MISR-based comparator is the complete absence of expected data with the MISR. This is only a potential advantage when the deterministic comparator requires pipelined expected data, because then a second "data generator and address generator pair" must generally be implemented, for the comparator's exclusive use. The MISR has its own disadvantages: (a) some small fraction of potential mismatches will escape detection because the MISR actually performs lossy data compaction; and (b) a genuine "primitive polynomial" must be implemented by the MISR, or else the data compaction becomes extremely lossy. The final contents of the MISR, which will be shifted out for inspection, is called "the signature". A distinct expected "signature" must be computed or simulated for each (custom memory, march test) pair that will be used, unlike the deterministic comparator, where a string of all 0's is always the expected "signature". For very large values of b, there is some concern surrounding the selection of a genuine "primitive polynomial". Published lists of primitive polynomials should not be trusted because of potential misprints. Verifying that a polynomial of order 50 and beyond is indeed primitive, is a very non-trivial matter. Therefore, to obtain a primitive polynomial representation one should select a verified polynomial of order 32, to be replicated 4 times, to obtain 128 bits, (or even 4 verified polynomials of different orders, that add up to 128, such as 31+33+29+35) instead of a single, unverified polynomial of order 128. FIG. 7 shows a 4-bit MISR, with a middle bit-slice implemented using an SEDFFTR. FIG. 7a illustrates four actual data entries each provided to a bit-wise exclusive OR operation, designated 720–723. Thereupon, the signal is presented to the SEDFFTRs, designated 710–713.

Figure 7B:
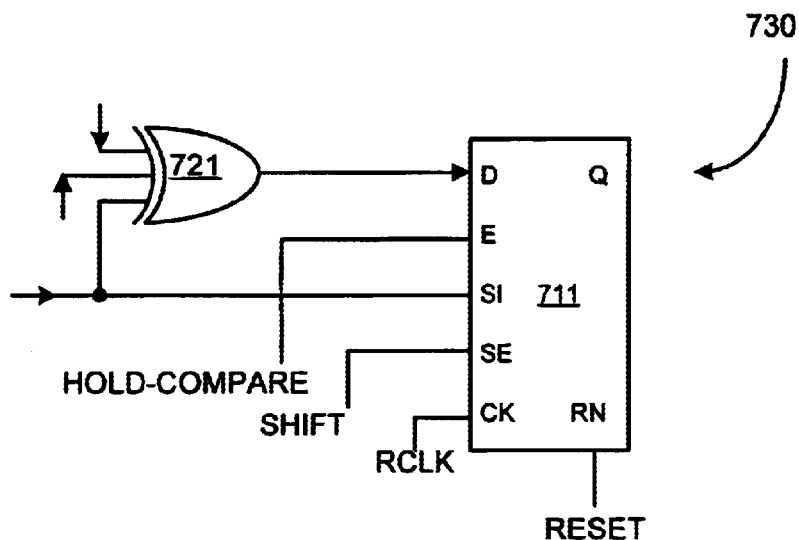
FIG. 7b illustrates a middle bit-slice using a SEDFFTR.

Just like the deterministic comparator, the MISR-based comparator needs 3 global signals for control, namely: RESET, SHIFT, HOLD-COMPARE, and the usual RCLK. As illustrated in FIG. 7b, the HOLD-COMPARE, SHIFT, RCLK and RESET are provided to the SEDFFTR 711, as is the output signal from EXOR 721. The final flip-flop's serial output performs the same role as the deterministic "serial-out mismatch", which is muxed-out on one of a plurality of output pads. Whether or not a feedback TAP appears at any given bit location is determined by the coefficients of the chosen primitive polynomial.

Further extensions are possible: (1) the primitive polynomial can be made wholly or partly programmable, by adding extra flip-flops and AND-gates to selectively control the optional feedback TAPs; this would involve adding 2 more global signals as well, (a) to control the shifting and (b) to supply the serial-in coefficient stream. (2) the MISR-based comparator may be combined with a deterministic comparator, by placing a 2-to-1 mux in front of the D pin of each SEDFFTR flop, and by using an extra global signal to select either the MISR's EXOR-gate for each bit, or the deterministic EXOR with OR-gate combination for each bit. Such comparator techniques are represented by step 805 of FIG. 8.

The table below shows how many globally broadcast signals are required for each possible combination of (a) fault coverage (F.C.) type: maximum (march, butterfly and galpat, plus flexible data generator), or minimum (march tests only, and minimal data generator); (b) comparator type: deterministic, or MISR-based; (c) expected data type (applies to deterministic comparator only): shared, or pipelined. All the rows refer to input-direction pads needed, except for the row entitled "shared-scan-outs", which are output-direction.

|  | Deterministic Comparator | | | | MISR-based Compare. | |
|---|---|---|---|---|---|---|
|  | Shared Expect Data | | Pipelined Expect Data | | (No Expect Data Used) | |
|  | Max. F.C. | Min. F.C. | Max. F.C. | Min. F.C. | Max. F.C. | Min. F.C. |
| global control | 5 | 5 | 5 | 5 | 5 | 5 |
| first addr. gen. | 5 | 2 | 5 | 2 | 5 | 2 |
| first data gen. | 3 | 2 | 3 | 2 | 3 | 2 |
| 2nd addr. gen. | 0 | 0 | 5 | 2 | 0 | 0 |
| second data gen. | 0 | 0 | 3 | 2 | 0 | 0 |
| data comp. | 3 | 3 | 3 | 3 | 3 | 3 |
| shared-scan-out | 8 | 8 | 8 | 8 | 8 | 8 |
| scan-mux select | 3 | 3 | 3 | 3 | 3 | 3 |
| Totals | 27 | 23 | 35 | 27 | 27 | 23 |

In addition to the above global signal requirements, there are a few more types of testability-related top-level signals, such as: (1) all the test-mode clocks, for which a device-dependant number will exist, (2) some clock-configuration signals, whose number is also device-dependant, and (3) the TESTEN signal, which is 1 pin.

Figure 8:
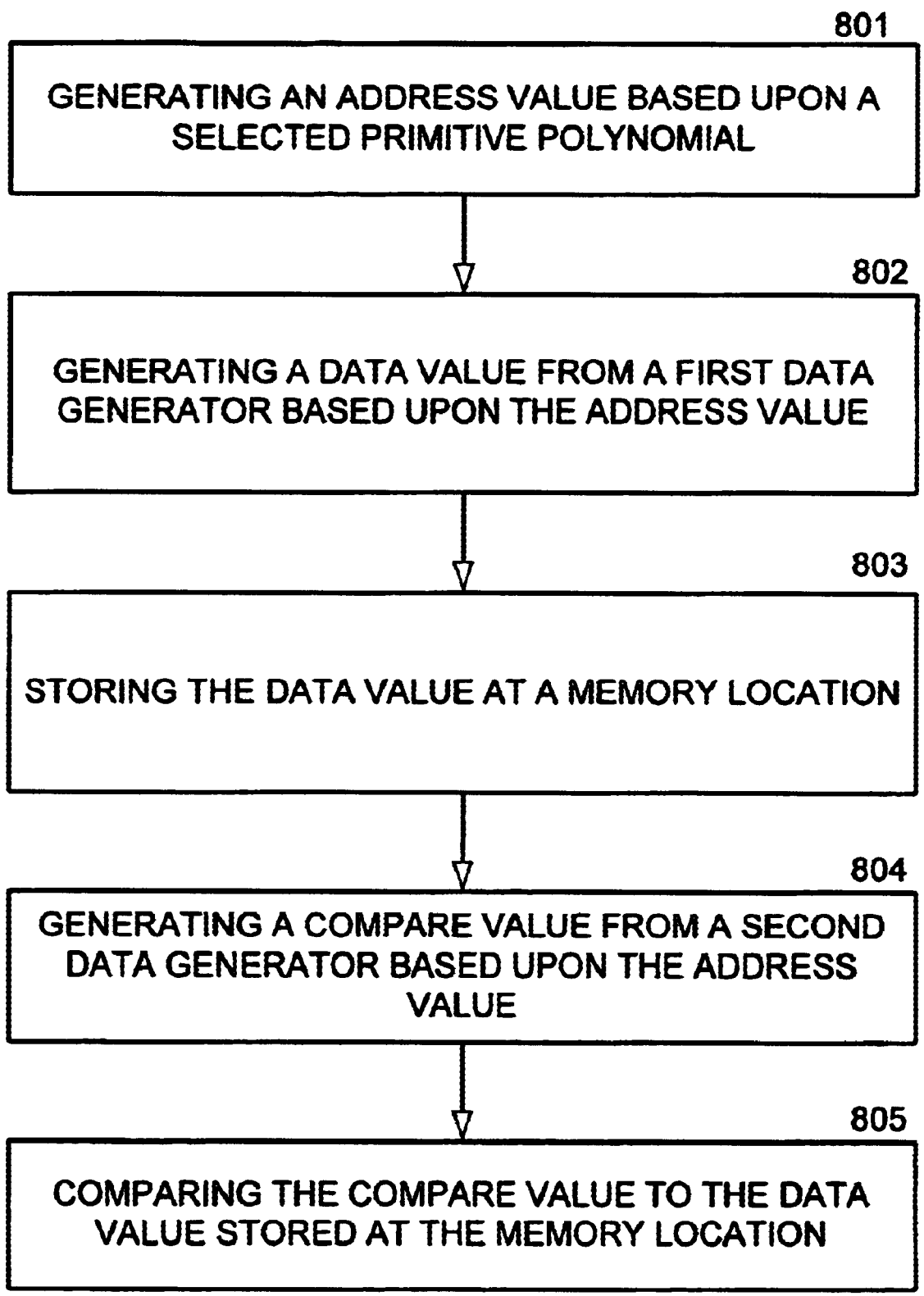
FIG. 8 illustrates a flow diagram in accordance with the present invention.

FIG. 8 illustrates a method in accordance with the present invention. Each of the individual steps of FIG. 8 has been discussed with reference to the specific implementations of FIGS. 2–7.

It should now be apparent that the present invention provides increased testability and flexibility for testing embedded memory systems. Furthermore, it should be understood that the present invention has been described with reference to specific embodiments. As such, other embodiments of the specific implementation are anticipated herein. For example, as discussed with reference to FIG. 6, four operations (Reset, Compare, Hold, Shift-Out) are associated with the latches 610 and 620. Therefore, an implementation receiving a two-bit control signal could be implemented to replace the illustrated three control signal implementation. (RESET, SHIFT, HOLD-COMPARE of FIG. 6)

I claim:

1. A method for testing a memory, the method comprising:
    providing a data value from a first data generator, wherein the first data generator receives a first address value from a first address generator and generates the data value based upon the first address value;
    storing the data value at a memory location;
    providing a compare value from a second data generator, wherein during a first mode of operation, the second data generator receives a second address value from a second address generator and generates the compare value based upon the second address value, wherein the first data generator is the same as the second data generator; and
    comparing the compare value to the data value stored at the memory location.

2. The method of claim 1, further comprising the step of:
    providing the first address value by receiving a primitive polynomial representation, and operating the first address generator based upon a pseudo-random bit-stream associated with the primitive polynomial representation.

3. The method of claim 1, wherein the step of providing a compare value further comprises the substep of during a second mode of operation, the second data generator generates a predetermined value allowing the contents of the memory location to be determined.

4. A method for testing a memory, the method comprising:
    receiving an address value from an address generator;
    generating a data value based upon the address value;
    providing the data value to a memory location;
    receiving a mode indicator, wherein when the mode indicator is in a first mode, the data value is used to test the memory associated with the memory location for address decoder faults; and
    when the mode indicator is in a second mode, the data value is used to test the memory associated with the memory location for coupling faults within memory locations.

5. The method of claim 4, wherein the step of generating further includes:
    generating the data value based upon an exclusive-or result.

6. The method of claim 5, wherein the step of generating further includes:
    selectively enabling the exclusive-or result using a first qualifier to generate the data value.

7. The method of claim 6, wherein the step of generating further includes:
    selectively enabling the exclusive-or result using a second qualifier to generate the data value.

8. The method of claim 4, further comprising:
    generating a compare value based upon the address value; and
    changing a polarity of compare value to provide an expected data value.

9. An integrated test system for verifying memory, the system comprising:
    a first gate having a first input to receive a memory value associated with a first memory location, a second input to receive a first expected value, and an output;
    a second gate having a first input to receive a memory value associated with a second memory location, a second input to receive a second expected value, and an output;
    a first latch having a data input port and a data output port;
    a first logic function having a first input coupled to the output of the first gate, a second input coupled to the output of the second gate, a third input to receive a data-bit from the data output port of the first latch, and an output to provide a data-bit to the data input port of the first latch;
    a third gate having a first input to receive a memory value associated with a third memory location, a second input to receive a third expected value, and an output;
    a second latch having a data input port and a data output port; and
    a second logic function having a first input coupled to the output of the third gate, a second input coupled to the output port of the second latch, and an output coupled to the data input port of the second latch.

10. The system of claim 9, wherein the first latch is a flip-flop and the first logic function is an OR-function.

11. The system of claim 9, wherein the first and second memory values are representative of data accessed by the first and second memory locations.

12. An integrated test system for verifying memory, the system comprising:
- a data generator having:
  - a plurality of inputs to receive an address value,
  - a plurality of outputs to provide a generated data value, and
  - at least one control input to control the generated data value;
- a memory to receive the generated data value, wherein the at least one control input includes an enable input to enable generation based on an incoming address value;
- a first logic gate having a first input to receive a first bit of the address value, a second input to receive an enable signal, and an output;
- a second logic gate having a first input to receive a second bit of the address value, a second input to receive the enable signal, and an output;
- a third logic gate having a first input to receive a third bit of the address value, a second input to receive the enable signal, and an output;
- a first exclusive-or gate having a first input to receive the first bit, and a second input to receive a first input of the at least one control input;
- a second exclusive-or gate having a first input to receive the second bit, and a second input to receive a second input of the at least one control input; and
- a third exclusive-or gate having a first input to receive the third bit, and a second input to receive the first input of the at least one control input.

13. The system of claim 12, wherein the at least one control input includes an exclusive-or enable input to modify the generated data value.

14. The system of claim 12, wherein the at least one control input includes multiple exclusive-or enable inputs to modify the generated data value.

15. A method of testing an integrated memory, the method comprising the steps of:
- when in a first mode of operation:
  - receiving a primitive polynomial representation; and
  - operating an address generator based upon the primitive polynomial representation;
- when in a second mode of operation:
  - performing at least one of a March-2 test and March-3 test.

16. The method of claim 15, wherein the primitive polynomial representation is formatted as a serial bit stream.

17. The method of claim 15, wherein the step of operating includes shifting the primitive polynomial representation into the address generator.

18. The method of claim 17, wherein the representation is software generated.

19. The method of claim 15, further comprising:
- when in a third mode of operation performing at least one of a March-4 test and March-5 test.

20. The method of claim 19, further comprising:
- when in a fourth mode of operation performing a Butterfly test.

21. The method of claim 20, further comprising:
- when in a fifth mode of operation performing a Galpat test.

22. The method of claim 15, wherein shift-registers are the only address sources.

* * * * *